(12) United States Patent
Swedberg et al.

(10) Patent No.: US 9,605,910 B2
(45) Date of Patent: Mar. 28, 2017

(54) HEAT SINK FOR USE WITH A LIGHT SOURCE HOLDING COMPONENT

(71) Applicant: IDEAL INDUSTRIES, INC., Sycamore, IL (US)

(72) Inventors: Benjamin D. Swedberg, Sycamore, IL (US); Alan E. Zantout, Sycamore, IL (US)

(73) Assignee: IDEAL Industries, Inc., Sycamore, IL (US)

( * ) Notice: Subject to any disclaimer, the term of this patent is extended or adjusted under 35 U.S.C. 154(b) by 854 days.

(21) Appl. No.: 13/788,373

(22) Filed: Mar. 7, 2013

(65) Prior Publication Data

US 2013/0233511 A1    Sep. 12, 2013

Related U.S. Application Data

(60) Provisional application No. 61/608,789, filed on Mar. 9, 2012.

(51) Int. Cl.
| | |
|---|---|
| *H05K 7/20* | (2006.01) |
| *F21V 29/77* | (2015.01) |
| *F28F 7/00* | (2006.01) |
| *F21V 27/02* | (2006.01) |
| *F21V 31/00* | (2006.01) |
| *F21V 23/02* | (2006.01) |
| *H02G 3/06* | (2006.01) |
| *H01L 23/367* | (2006.01) |
| *F21V 23/00* | (2015.01) |

(52) U.S. Cl.
CPC .............. *F28F 7/00* (2013.01); *F21V 23/026* (2013.01); *F21V 27/02* (2013.01); *F21V 29/773* (2015.01); *F21V 31/005* (2013.01); *H02G 3/0616* (2013.01); *F21V 23/002* (2013.01); *F21V 23/009* (2013.01); *F21V 29/77* (2015.01); *F21V 29/777* (2015.01); *H01L 23/3675* (2013.01); *H05K 7/20409* (2013.01)

(58) Field of Classification Search
CPC ......................... F21V 29/004; H05K 7/20409
USPC ......... 165/80.3, 185; 362/294, 373; 361/704
See application file for complete search history.

(56) References Cited

U.S. PATENT DOCUMENTS

| | | | |
|---|---|---|---|
| 1,408,519 A | 3/1922 | Langer | |
| 4,959,506 A * | 9/1990 | Petty | ...................... H02G 3/14 174/669 |
| 5,272,611 A | 12/1993 | Lai | |
| 5,695,275 A * | 12/1997 | Markiewicz | ............ F21V 19/00 362/294 |

(Continued)

FOREIGN PATENT DOCUMENTS

| | | |
|---|---|---|
| WO | 2004/018930 A2 | 3/2004 |
| WO | 2008/067447 A1 | 6/2008 |
| WO | 2012/075357 A2 | 6/2012 |

OTHER PUBLICATIONS

European Patent Office, Communication issued on European patent application No. 13158481.5, dated Apr. 22, 2015, 3 pages.

(Continued)

*Primary Examiner* — Leonard R Leo
(74) *Attorney, Agent, or Firm* — Greenberg Traurig, LLP

(57) ABSTRACT

A heat sink for use in connection with a LED light source holding assembly is provided with a flexible conduit fitting that is used to secure a flexible conduit directly to the heat sink. The heat sink may be provided with a sealed, integrated junction box.

2 Claims, 10 Drawing Sheets

(56) References Cited

U.S. PATENT DOCUMENTS

| | | | |
|---|---|---|---|
| 6,582,100 B1 | 6/2003 | Hochstein et al. | |
| 7,259,337 B1* | 8/2007 | Gretz | H02G 3/06 |
| | | | 174/481 |
| 7,405,944 B2 | 7/2008 | Mayer et al. | |
| 7,744,254 B2* | 6/2010 | Spiro | F21S 8/06 |
| | | | 362/265 |
| 7,988,336 B1 | 8/2011 | Harbers et al. | |
| 8,142,057 B2* | 3/2012 | Roos | F21V 29/004 |
| | | | 362/373 |
| 8,403,541 B1* | 3/2013 | Rashidi | F21S 8/026 |
| | | | 362/294 |
| 8,567,987 B2* | 10/2013 | Wronski | F21V 7/00 |
| | | | 362/236 |
| 8,890,414 B2* | 11/2014 | Rowlette, Jr. | F21S 8/026 |
| | | | 315/113 |
| 9,068,719 B2* | 6/2015 | Van De Ven | F21V 29/773 |
| 2006/0141851 A1 | 6/2006 | Matsui et al. | |
| 2006/0227558 A1 | 10/2006 | Osawa et al. | |
| 2006/0285349 A1 | 12/2006 | Helbig et al. | |
| 2007/0268707 A1 | 11/2007 | Smester | |
| 2010/0302778 A1* | 12/2010 | Dabiet | F21S 8/02 |
| | | | 362/249.02 |
| 2011/0063849 A1 | 3/2011 | Alexander et al. | |
| 2011/0141728 A1 | 6/2011 | Russello et al. | |
| 2011/0164424 A1 | 7/2011 | Breen, IV et al. | |
| 2011/0222291 A1* | 9/2011 | Peng | F21V 15/01 |
| | | | 362/294 |
| 2012/0057352 A1 | 3/2012 | Wilcox et al. | |
| 2012/0305230 A1 | 12/2012 | Breen, IV et al. | |

OTHER PUBLICATIONS

European Patent Office, extended European search report issued on European patent application No. 13158481.5, dated Oct. 20, 2015, 13 pages.

ISA/US, International Search Report and Written Opinion of PCT Application No. US12/57061, date of mailing of ISR/WO Dec. 4, 2012, 13 pages.

* cited by examiner

HEAT SINK FOR USE WITH A LIGHT SOURCE HOLDING COMPONENT

CROSS REFERENCE TO RELATED APPLICATION

This application is a non-provisional application claiming priority from U.S. Provisional Application Ser. No. 61/608,789, filed Mar. 9, 2012, entitled "Heat Sink for Use with a Light Source Holding Component" and incorporated herein by reference in its entirety.

FIELD OF THE DISCLOSURE

The present description relates generally to light source holding devices, and more particularly to a heat sink for use with a light source holding component

BACKGROUND OF RELATED ART

Assemblies for holding a source of light, e.g., a LED light engine or a LED light module, are known in the art. By way of example, U.S. application Ser. No. 13/309,675, now published US patent application No. 2012/0305230, which is commonly assigned and which is incorporated herein by reference in its entirety, describes a light source holding component sized and arranged to securely receive a source of light. The light source holding component is intended to be attached to a mounting surface, such as a heat sink. In one described embodiment, the heat sink is provided with an integrated junction box to thereby reduce the part count of the device. An additionally described embodiment includes an accessory mounting feature. The accessory mounting feature is adapted to cooperate with an accessory to provide a seal against the mounting surface to which the light source holding component is attached.

SUMMARY

Described hereinafter is an improved heat sink for use in an assembly for holding a source of LED light. In one described embodiment, the subject heat sink is provided with a flexible conduit fitting that uses a screw or other piece of hardware to secure the flexible conduit to the heat sink. In this manner, wiring, e.g., Class 1 wiring used in connection with an LED light engine, may be enclosed by being passed through the heat sink and the flexible conduit attached thereto. In a second described embodiment, the heat sink is provided with a sealed, integrated junction box. In this manner, when the assembly includes a sealing accessory such as described in the aforementioned U.S. application Ser. No. 13/309,675, a lamp holding assembly that is totally sealed from water egress is provided.

While the foregoing provides a general description of the subject heat sinks usable in connection with an assembly for holding a source of light and some advantages thereof, a better understanding of the objects, advantages, features, properties, and relationships of the subject heat sinks will be obtained from the following detailed description and accompanying drawings which set forth illustrative embodiments and which are indicative of the various ways in which the principles of the invention may be employed.

BRIEF DESCRIPTION OF THE DRAWINGS

For a better understanding of the hereinafter described heat sinks for use in connection with assemblies for holding a source of light, reference may be had to the following drawings in which.

DETAILED DESCRIPTION

The following description of example methods and apparatus is not intended to limit the scope of the description to the precise form or forms detailed herein. Instead the following description is intended to be illustrative so that others may follow its teachings.

Turning now to the Figures, illustrated are various embodiments of heat sinks that are usable to construct an assembly for holding a source of light, particularly a source of LED light such as a LED light engine or a LED light module.

Figure 1:
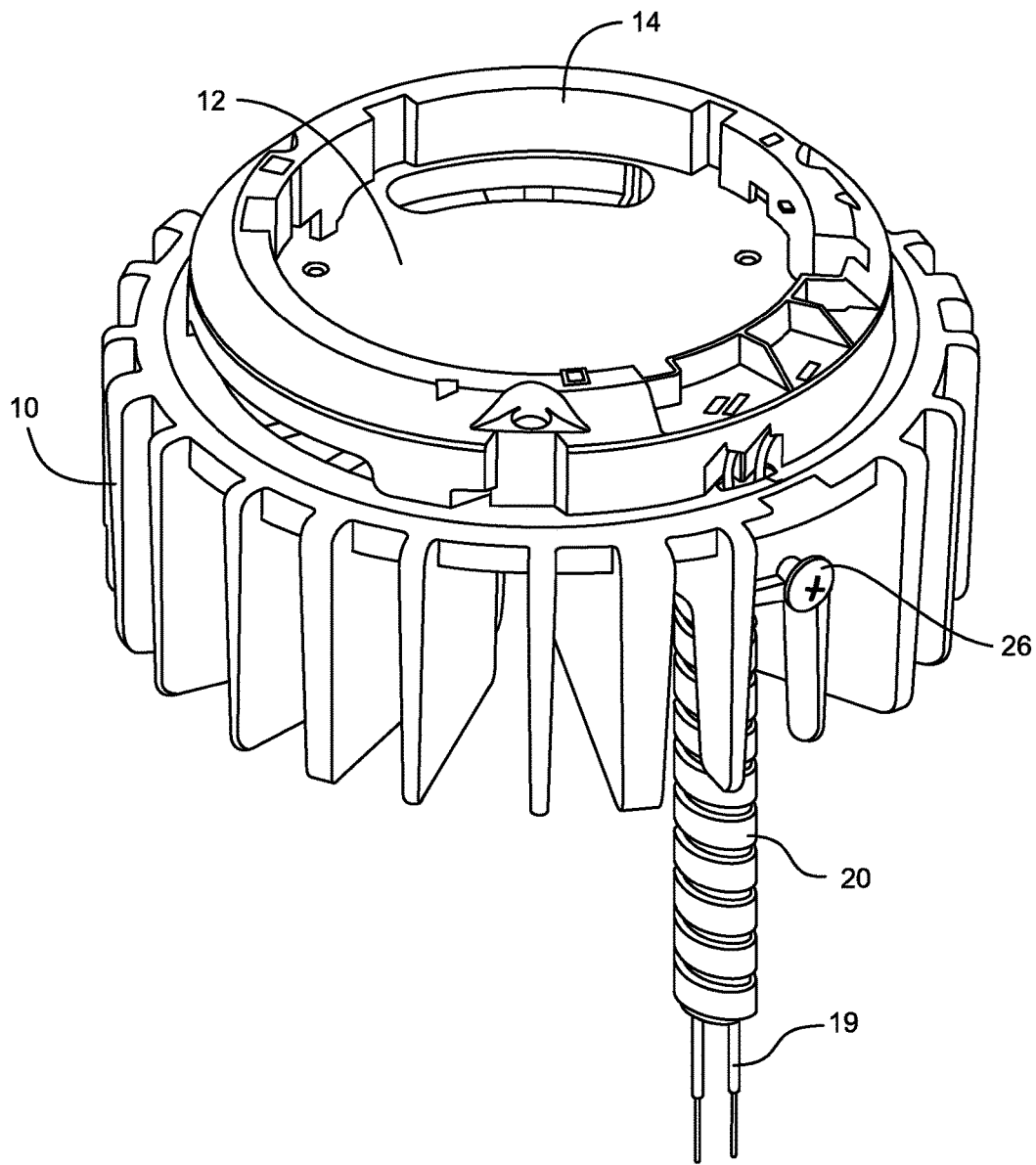
FIG. 1 illustrates a lamp holding assembly including a first embodiment of a heat sink adapted for securing a flexible conduit thereto.
Figure 2:
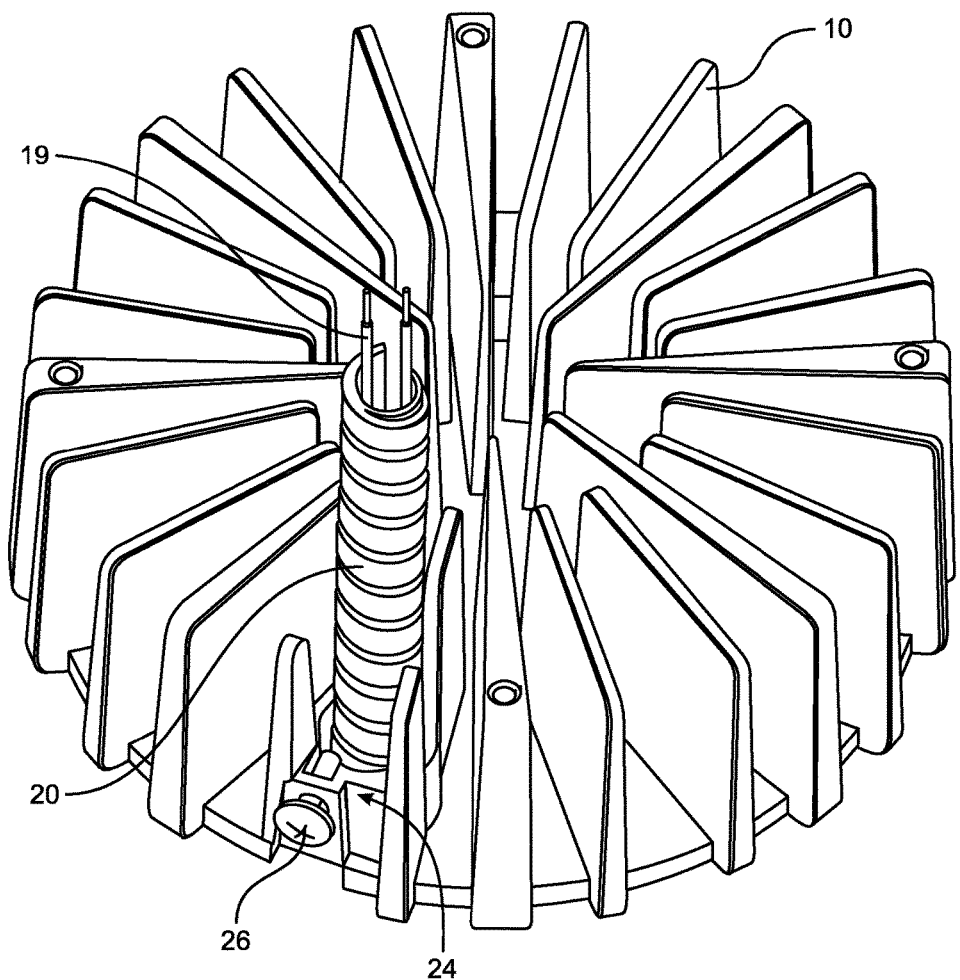
FIG. 2 illustrates a bottom view of the heat sink of FIG. 1 with a flexible conduit attached thereto.
Figure 3:
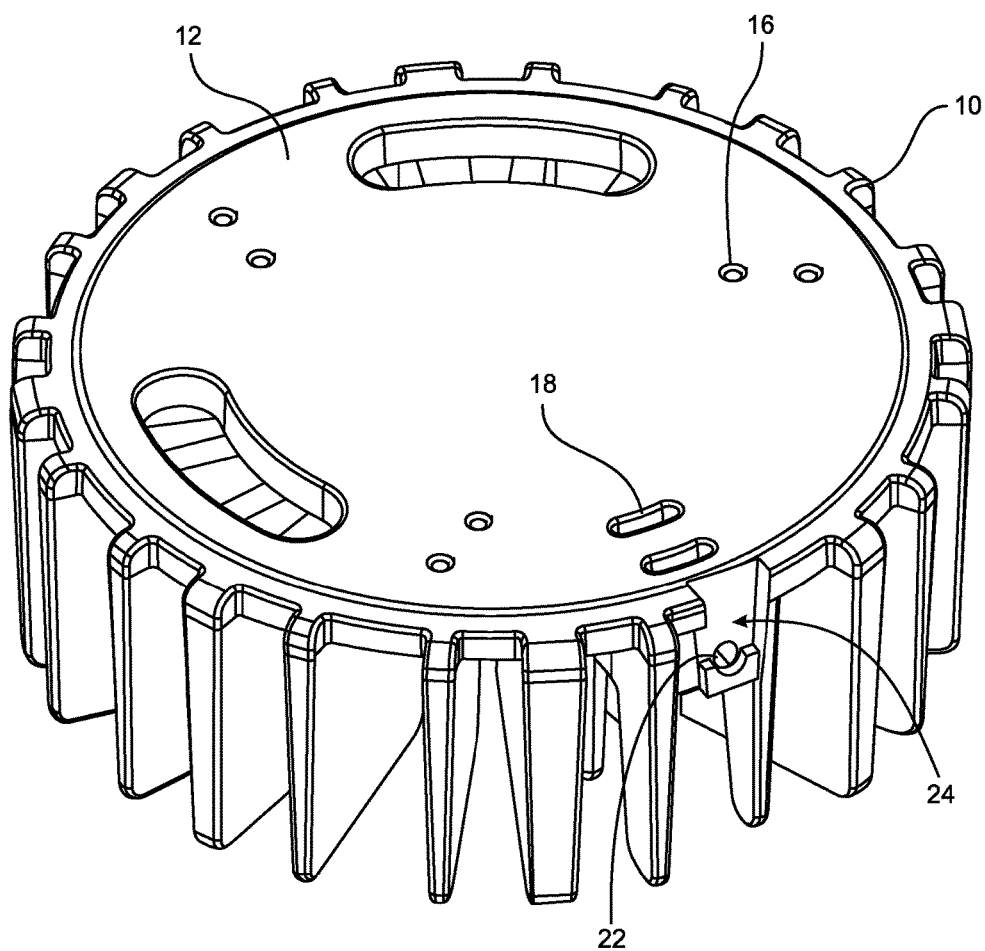
FIG. 3 illustrates a top view of the heat sink of FIG. 1.
Figure 4:
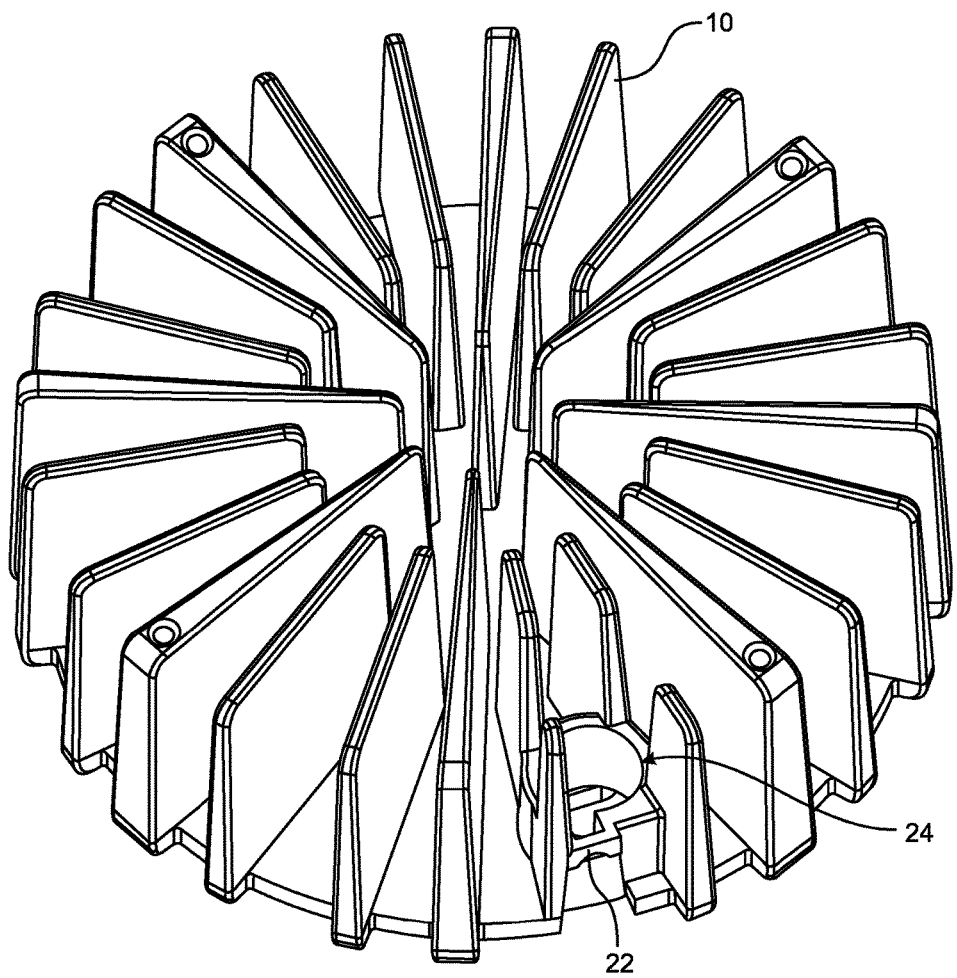
FIG. 4 illustrates a bottom view of the heat sink of FIG. 1 without a flexible conduit attached thereto.
Figure 5:
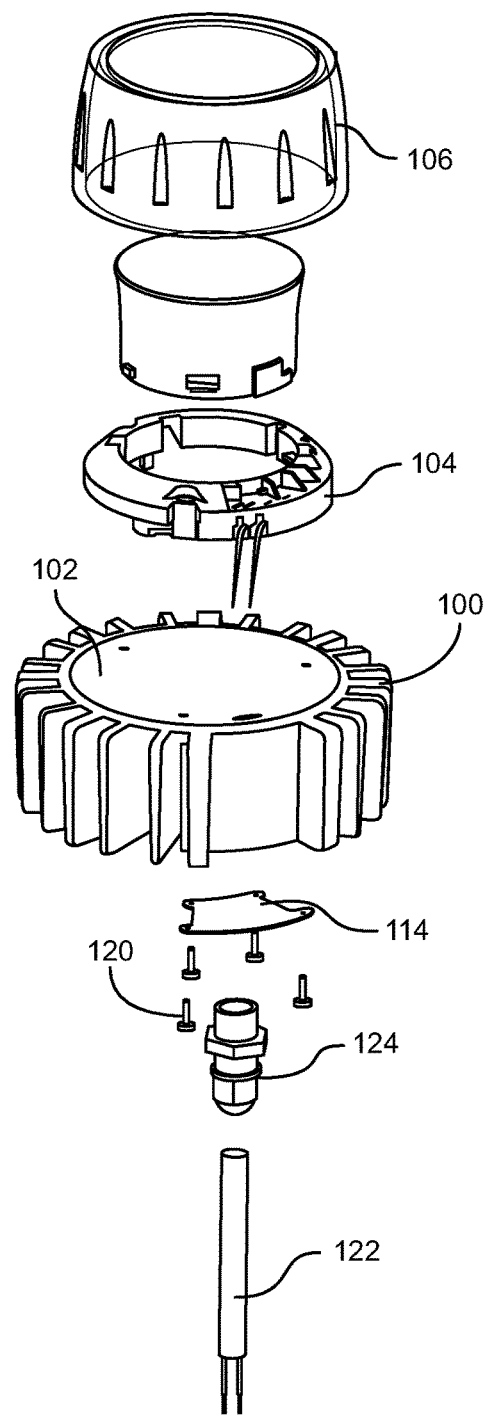
FIG. 5 illustrates an exploded view of a lamp holding assembly including a second embodiment of a heat sink having a sealed, integral junction box.

Considering now FIGS. 1-4, illustrated is a first embodiment of a heat sink 10 which includes a mounting surface 12 to which a light source holding component or socket 14 is to be attached. As an exemplary light source holding component 14 is illustrated and described in the incorporated U.S. application Ser. No. 13/309,675, the exemplary light source holding component 14 will not be described in detail herein for the sake of brevity. Nevertheless, it is noted that the mounting surface 12 of the heat sink may include apertures 16 as needed to accommodate hardware used to attach the light source holding component 14 thereto as well as one or more apertures 18 through which wiring 19 associated with the source of LED light is to pass as shown in FIG. 3. As further illustrated in FIG. 4, the apertures 18 are aligned with a flexible conduit fitting 24 having sides walls which form an opening that is size to receive a flexible conduit 20. As will be appreciated, when the flexible conduit 20 is positioned within the flexible conduit fitting 24 as shown in FIGS. 1 and 2, the wiring 19 may be passed through the apertures 18 and directly into the flexible conduit 20 to thereby provide shrouding for the wires 19 as needed.

For securing the flexible conduit 20 within the flexible conduit fitting 24, the side walls of the flexible conduit fitting 24 include an opening 22 which is adapted to receive a clamping screw 26. In this manner, once the flexible conduit 20 is positioned within the flexible conduit fitting 24, the clamping screw 26 may be tightened to thereby securely engage the flexible conduit 20 to the heat sink 10. While a clamping screw 26 is illustrated for this purpose, those of ordinary skill in the art will appreciate that the flexible conduit fitting 24 can be arranged such that other pieces of hardware could be employed to clamp or otherwise secure the flexible conduit 20 to the heat sink 10, e.g., a pin, spring clip, wire ring, etc. Still further, it will be appreciated that the flexible conduit 20 may be mounted and/or otherwise secured perpendicularly to the mounting surface 12 or at any other suitable relative angle as desired.

Figure 6:
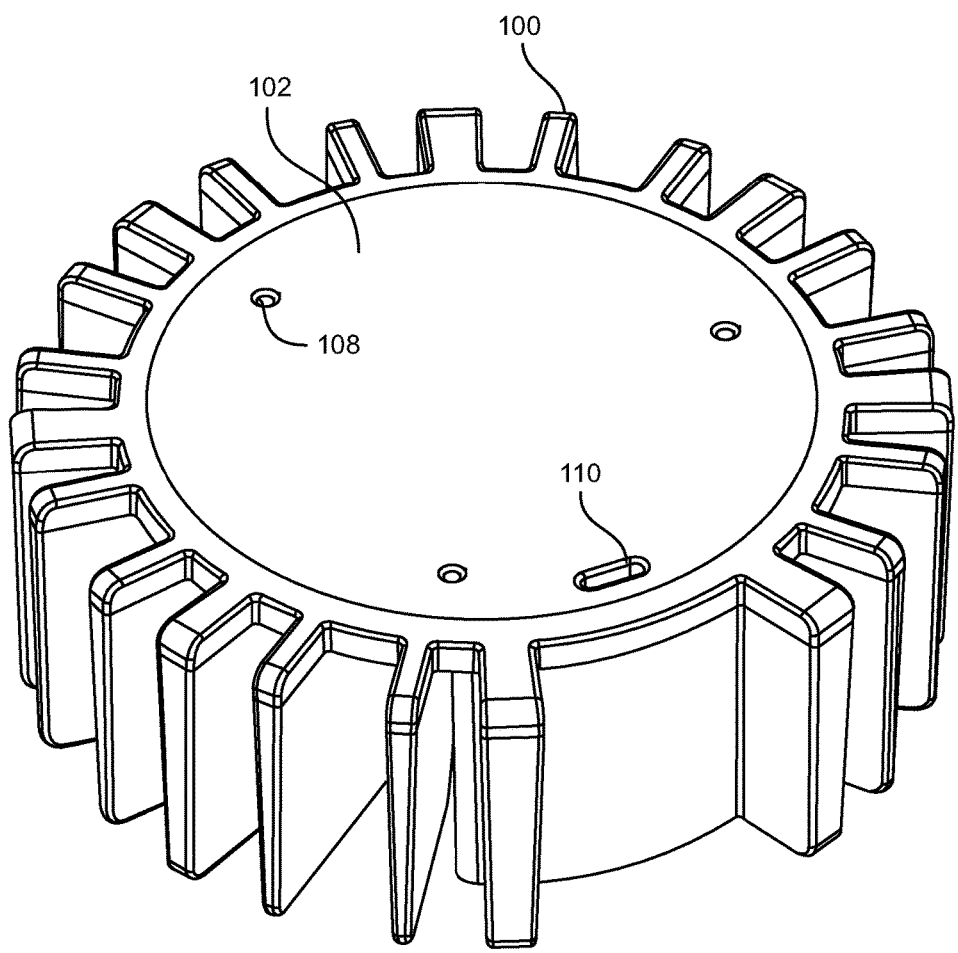
FIG. 6 illustrates a top view of the heat sink of FIG. 5.

Considering now FIGS. 5-10, illustrated is a second embodiment of a heat sink 100 which includes a mounting surface 102 to which a light source holding component or socket 104 is to be attached. The light source holding component 104 is particularly adapted carry an accessory 106 and, by use of a seal, provide a sealing engagement between the accessory 106 and the mounting surface 102 of the heat sink 100. Again, as the exemplary light source holding component 104 and components used to provide a sealing engagement between the accessory 106 and the mounting surface 102 of the heat sink 100 is illustrated and described in the incorporated U.S. application Ser. No. 13/309,675, the exemplary light source holding component 104 and such components will not be described in detail herein for the sake of brevity. Nevertheless, it is noted that the mounting surface 102 of the heat sink may include apertures, such as mounting holes 108 (preferably apertures that would not go all the way through the heat sink 100 so a prevent provision of a water leakage passage) as needed to accommodate hardware used to attach the light source holding component 104 thereto as well as one or more apertures 110 through which wiring associated with the source of LED light is to pass as shown in FIG. 6.

Figure 7:
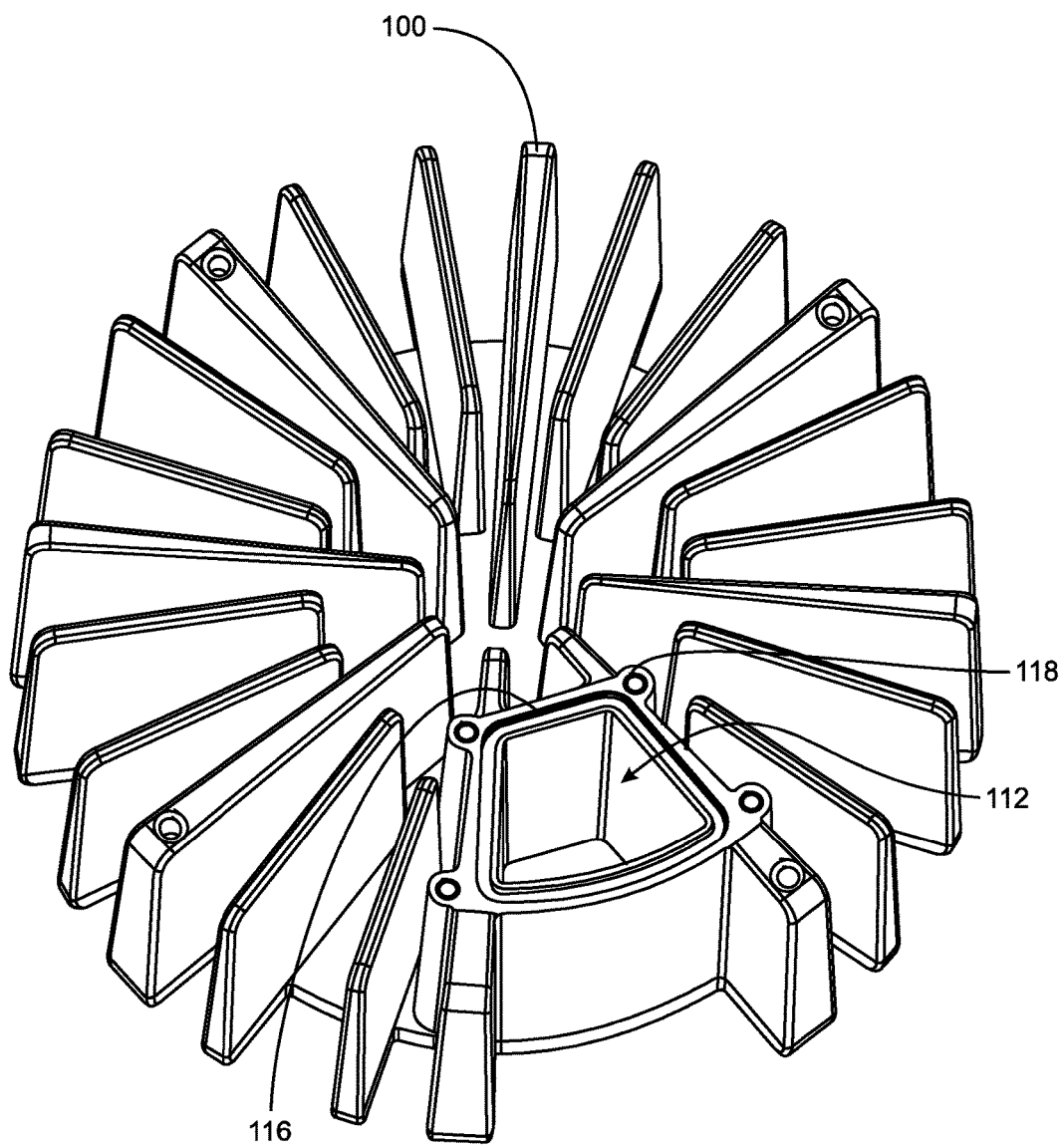
FIG. 7 illustrates a bottom view of the heat sink of FIG. 6 without a cover being attached to the integrally formed junction box.
Figure 8:
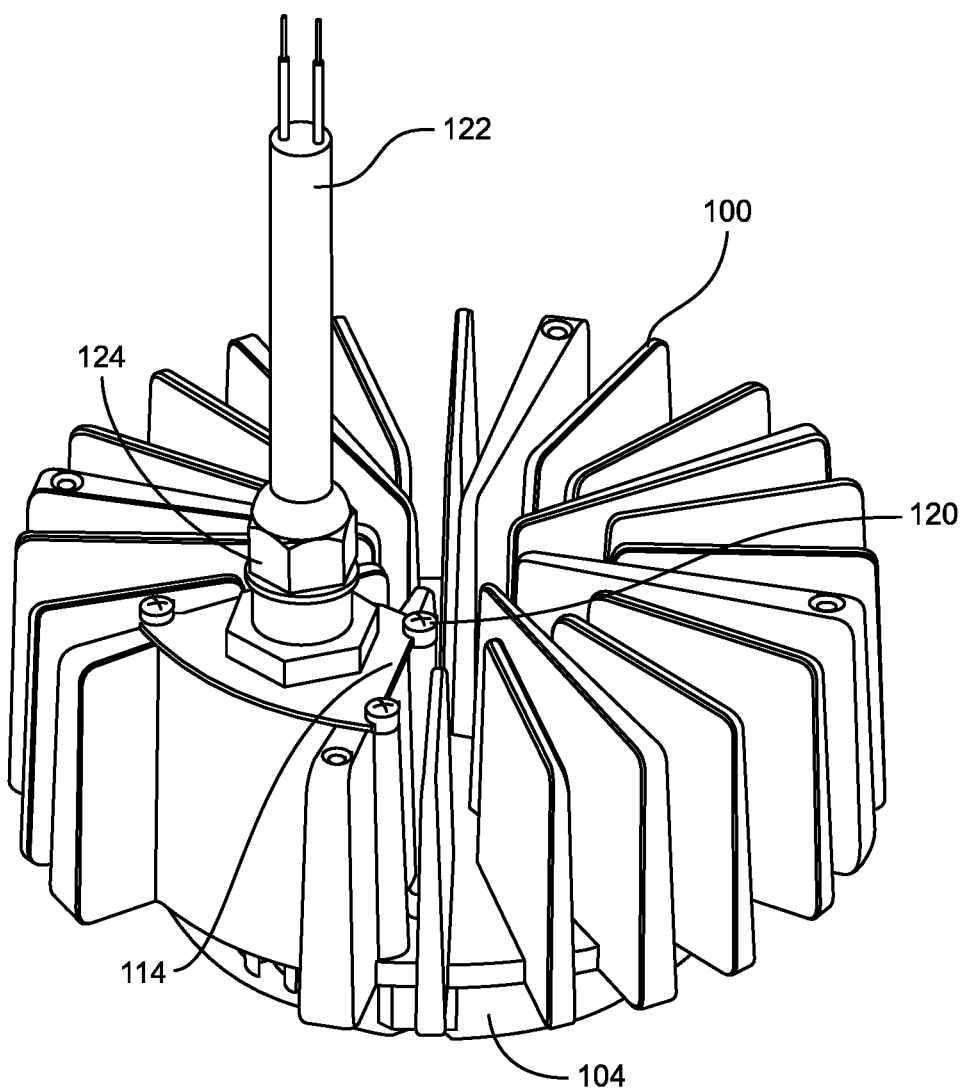
FIG. 8 illustrates a bottom view of the heat sink of FIG. 6 with a cover being attached to the integrally formed junction box.
Figure 9:
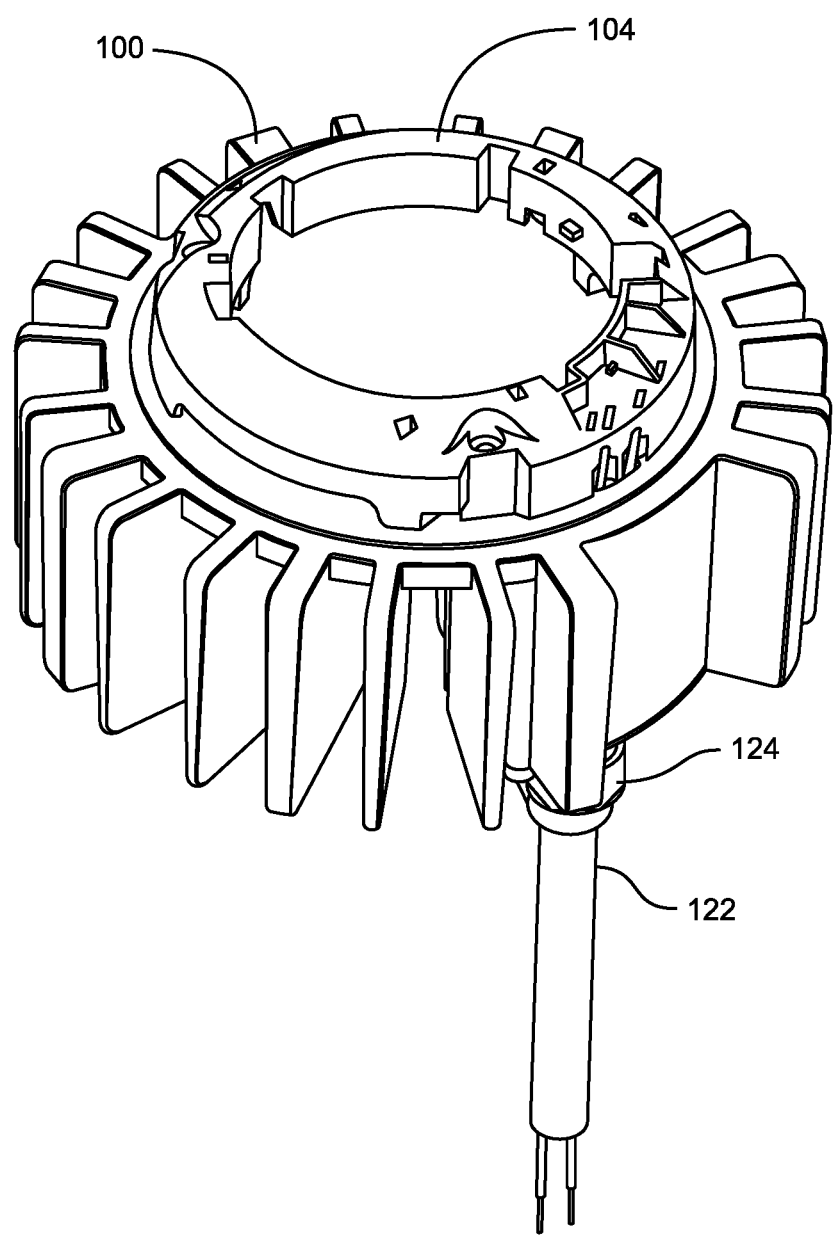
FIG. 9 illustrates a top view of the assembly of FIG. 1 without an accessory being attached thereto.
Figure 10:
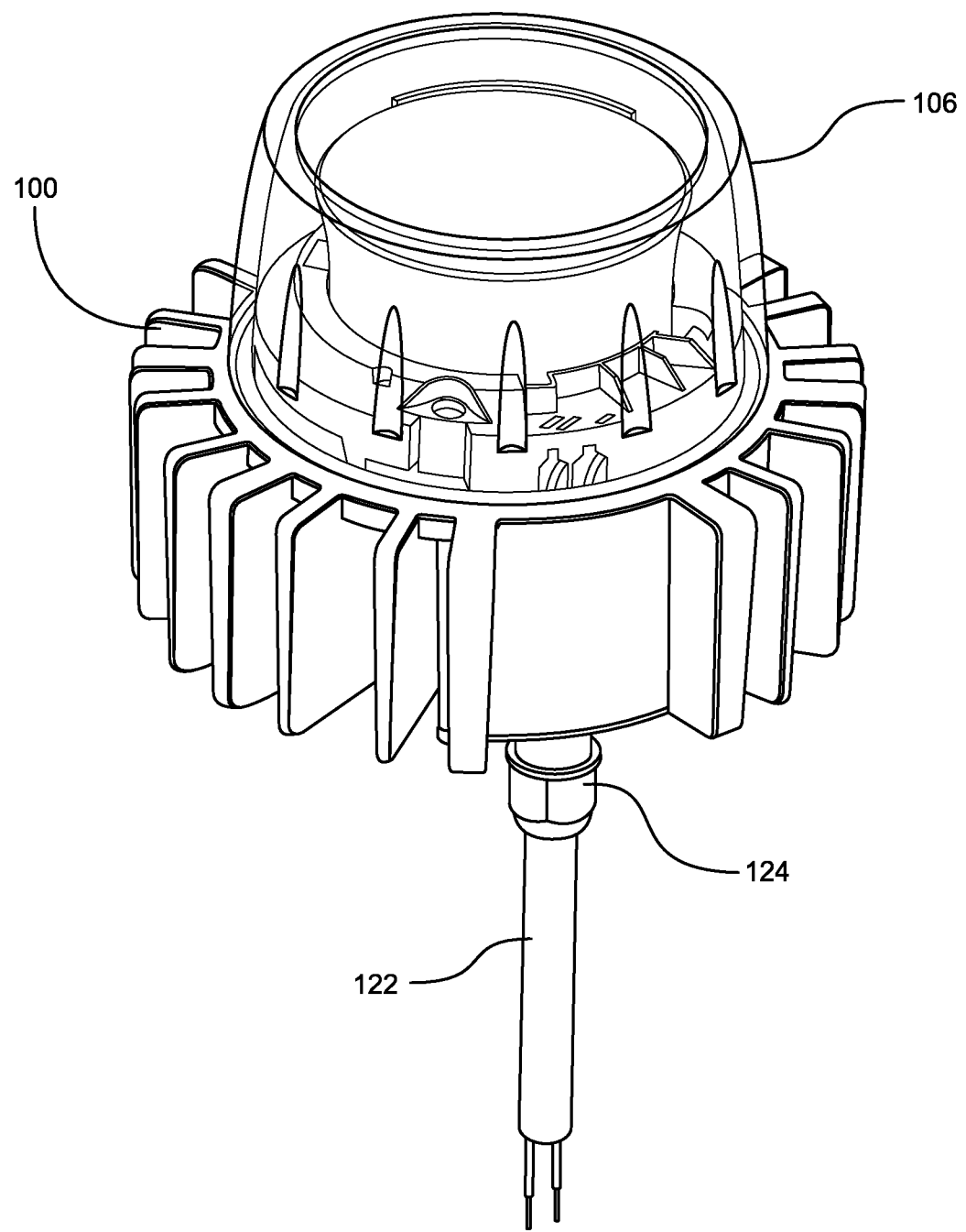
FIG. 10 illustrates a top view of the assembly of FIG. 1 with an accessory attached thereto providing a water tight luminaire.

As further illustrated in FIGS. 7 and 8, the aperture 110 leads to a junction box 112 that is integrally formed on a backside of the heat sink 100. A junction box cover 114 is further provided and, if needed, a sealing area 116, such a groove or channel, can be provided around the opening to the junction box 112 for receiving a gasket or the like to thereby assist in providing a water tight seal between the junction box cover 114 and the heat sink 100 relative to the opening to the junction box 112. As additionally illustrated, the heat sink 100 may be provided with openings, such as threaded openings 118 for receiving correspondingly fasteners, such as threaded screws 120 which are used to attach the junction box cover 114 to the heat sink 100. It will be understood that any suitable opening and/or fastener may be utilized as desired. A wire carrying cable or conduit 122 having a water tight fitting 124 may be mounted to the junction box cover 114 as particularly shown in FIGS. 5 and 8. In this manner, when the heat sink 100 with a sealable, integrated junction box 112 is used in connection with a sealing accessory 106 such as described in the aforementioned U.S. application Ser. No. 13/309,675 a lamp holding assembly that is totally sealed from water egress is provided.

While specific embodiments of the subject invention have been described in detail, it will be appreciated by those skilled in the art that various modifications and alternatives to those details could be developed in light of the overall teachings of this disclosure. For example, it is to be appreciated that features described with respect to the various embodiments are not to be limited to any particular embodiment but may be freely used across embodiments where applicable. Additionally, it will be appreciated that the size, shape, arrangement, and/or number of components illustrated and described can be changed as necessary to meet a given need. Accordingly, the particular arrangements disclosed are meant to be illustrative only and not limiting as to the scope of the invention which is to be given the full breadth of the appended claims and any equivalents thereof.

We claim:

1. A device, comprising:
a heat sink having a mounting surface for carrying a light source holding component and an opposed surface from which a plurality of radially oriented, heat dissipating fins extend;
a junction box having a first wall formed by at least a portion of the opposed surface of the heat sink, a second wall formed in its entirety from a first surface of a first one of the plurality of heat dissipating fins, a third wall formed in its entirety from a first surface of a second one of the plurality of heat dissipating fins, a fourth wall that extends from the first surface of the first one of the plurality of heat dissipating fins to the first surface of the second one of the plurality of heat dissipating fins, and a fifth wall, opposite to and spaced from the fourth wall, that also extends from the first surface of the first one of the plurality of heat dissipating fins to the first surface of the second one of the plurality of heat dissipating fins;
a gasket; and
a junction box cover sized to cover the junction box, the junction box cover being removeably attachable to one or more of at least a second surface of the first one of the plurality of heat dissipating fins, a second surface of the second one of the plurality of heat dissipating fins, and the opposed walls;
wherein the heat sink has at least one wire accepting aperture that extends between the mounting surface and the at least a portion of the opposed surface of the heat sink, each of the second surface of the first one of the plurality of heat dissipating fins, the second surface of the second one of the plurality of heat dissipating fins, and the opposed walls have a channel formed therein, and the gasket is positioned with the channels to thereby be interposed between the junction box cover and the second surface of the first one of the plurality of heat dissipating fins, the second surface of the second one of the plurality of heat dissipating fins, and the opposed walls.

2. A device, comprising:
a heat sink having a mounting surface for carrying a light source holding component and an opposed surface from which a plurality of radially oriented, heat dissipating fins extend;
a junction box having a first wall formed by at least a portion of the opposed surface of the heat sink, a second wall formed in its entirety from a first surface of a first one of the plurality of heat dissipating fins, a third wall formed in its entirety from a first surface of a second one of the plurality of heat dissipating fins, a fourth wall that extends from the first surface of the first one of the plurality of heat dissipating fins to the first surface of the second one of the plurality of heat dissipating fins, and a fifth wall, opposite to and spaced from the fourth wall, that also extends from the first surface of the first one of the plurality of heat dissipating fins to the first surface of the second one of the plurality of heat dissipating fins;
a junction box cover sized to cover the junction box, the junction box cover being removeably attachable to one or more of at least a second surface of the first one of the plurality of heat dissipating fins, a second surface of the second one of the plurality of heat dissipating fins, and the opposed walls; and
a wire carrying cable coupled to the junction box cover via use of a water tight fitting;

wherein the heat sink has at least one wire accepting aperture that extends between the mounting surface and the at least a portion of the opposed surface of the heat sink.

* * * * *